United States Patent [19]

Cross

[11] 3,836,904

[45] Sept. 17, 1974

[54] OUTPUT ENCODER AND LINE DRIVER

[75] Inventor: Charles Cross, Glenside, Pa.

[73] Assignee: Robertshaw Controls Company, Richmond, Va.

[22] Filed: Dec. 12, 1972

[21] Appl. No.: 314,306

[52] U.S. Cl. .................. 340/347 DD, 340/174.1 G, 340/174.1 H

[51] Int. Cl. .......................................... H03k 13/24

[58] Field of Search ............ 340/347 DD, 174.1 G, 340/174.1 H; 178/68

[56] References Cited

UNITED STATES PATENTS

| | | | |
|---|---|---|---|
| 3,349,374 | 10/1967 | Gabrielson et al. | 340/163 |
| 3,361,978 | 1/1968 | Fiorini | 328/94 |
| 3,384,874 | 5/1968 | Morley et al. | 340/163 |
| 3,576,947 | 5/1971 | Kruger | 340/146.1 D |
| 3,582,786 | 6/1971 | Brugelmans | 340/146.1 BA |
| 3,600,700 | 8/1971 | Matsuo | 340/170 X |
| 3,623,041 | 11/1971 | MacDougall | 340/174.1 G |
| 3,631,463 | 12/1971 | Murphy | 340/347 DD |
| 3,641,524 | 2/1972 | Norris | 340/174.1 H |
| 3,678,503 | 7/1972 | Sollman | 340/347 DD |
| 3,680,050 | 7/1972 | Griffin | 340/167 R |
| 3,689,913 | 9/1972 | Newcomb | 340/347 DD |
| 3,697,977 | 10/1972 | Sollman et al. | 340/347 DD |

OTHER PUBLICATIONS

Booye, "The Miller Coding in Direct PCM –," 10/1970 4 sheets.

*Primary Examiner*—Thomas J. Sloyan
*Attorney, Agent, or Firm*—Anthony A. O'Brien

[57] ABSTRACT

A transmitter sequencer is disclosed having an encoder section and a transmission line driving section. The encoder serves to generate a biphase output code from an input level and to pass the coded message to the line driver. The line driver is normally inhibited to prevent undue loading of the transmission line, but is enabled when a message in biphase code is to be transmitted.

5 Claims, 3 Drawing Figures

OUTPUT ENCODER AND LINE DRIVER

BACKGROUND OF THE INVENTION

1. Field of the Invention

The present invention relates to a method and apparatus for generating a biphase output code from an input level and driving the encoded message over a transmission line.

2. Description of the Prior Art

The prior art devices have required a substantial amount of apparatus to generate a biphase Manchester code. This apparatus has, for example, required both positive and negative power supplies to drive the line and has been limited to logic voltage levels in driving the line.

SUMMARY OF THE INVENTION

The present invention is characterized by a transmitter sequencer for forming a biphase output coded message from input levels and includes an encoder portion and a transmission line driving portion. The encoder portion includes an output device connected to receive input levels from a gating arrangement and an encoder device for selectively enabling the gating arrangement and clocking the input levels. This line driving portion has a voltage source and line drive transistors connected to drive the line from the source. A second gating arrangement is connected between the output device and line drive transistors to enable the latter in accordance with the output of the former. The line driver is arranged to be normally disconnected from the transmission the line, except when a message is being transmitted, thus preventing undue loading of the line.

It is an object of the present invention to provide a method and apparatus for generating a biphase output code from an input level and to drive this coded output over a transmission line at high voltage levels.

It is also an object of the present invention to teach a method and apparatus for generating and transmitting a biphase output code in which the transmitter will be disconnected from the line except when a message is to be transmitted thus preventing undue loading of the transmission line.

A further object of the present invention is to construct a transmitter sequencer and line driver which uses a single power supply to drive a biphase outlet over a transmission line.

Yet another object of the present invention is to construct a transmitter sequencer having an output which, when coupled through line driver to a transmission line, will cause the voltage on the line to change in such a manner that it will follow the bit output from a register or the like.

The foregoing and other objects will become apparent from the following detailed description of a preferred embodiment taken in connection with the accompanying drawings.

DESCRIPTION OF THE PREFERRED EMBODIMENT

In any data transmission and/or encoding system the selection of code format and method of identifying the code are extremely important since much of the speed, efficiency and reliability of the system depends upon the code. The present system has been designed to produce a biphase Manchester code, in which only the transitions in the middle of a bit are considered, from an input level which may come from a register or a reference level.

Figure 3:
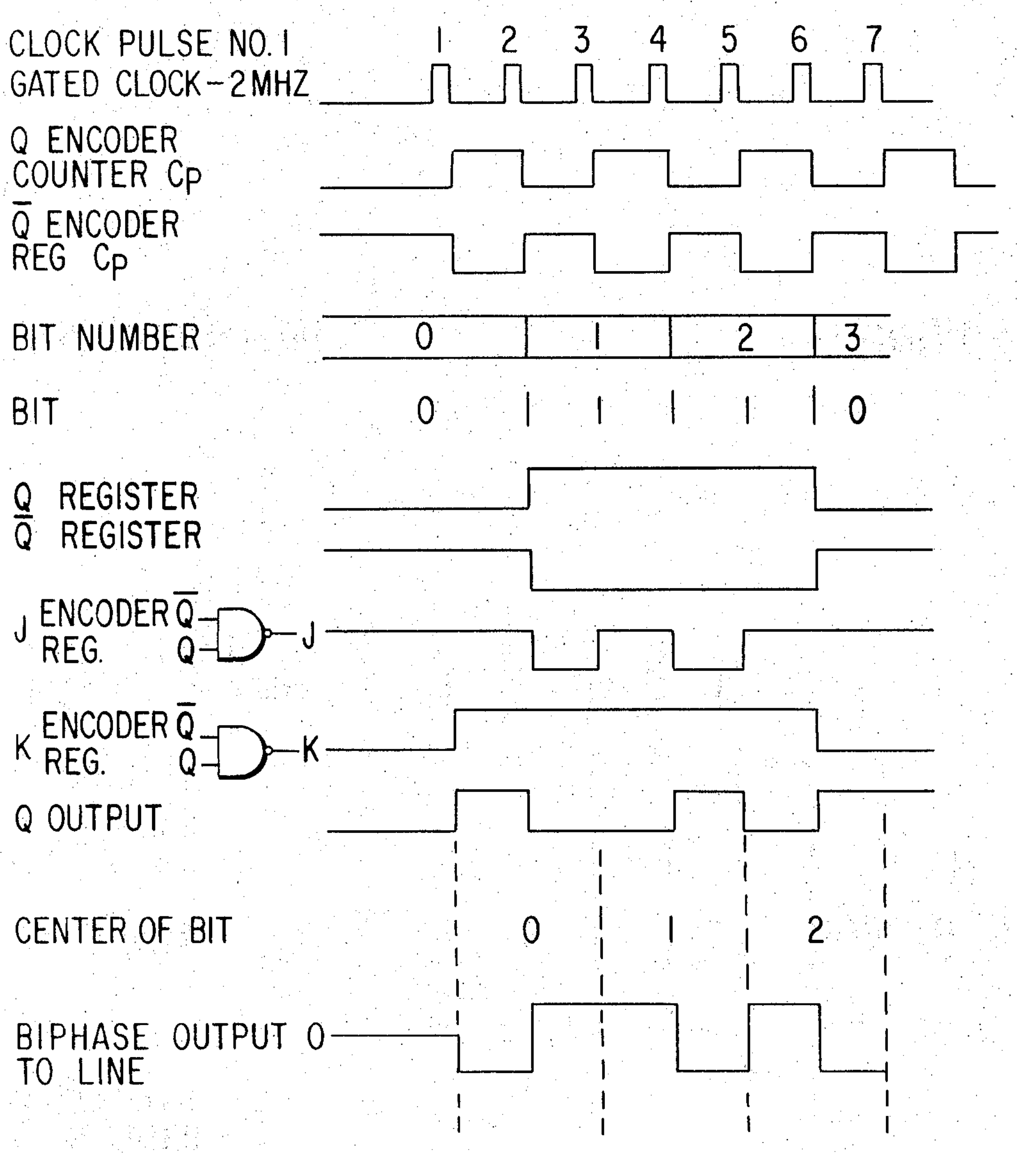
FIG. 3 is a timing chart showing the outputs of the present invention.

Only the first three bits of a message have been shown in the timing chart of FIG. 3. These three bits represent a synchronizing code which would normally and preferably precede a message. The message would have a length determined by the information, such as addresses and instructions, to be transmitted. The biphase output would have to have an amplitude sufficient to exceed the expected noise level in both the positive and negative directions. A level comparator would be used at the receiver to discriminate against signals below these levels. The biphase word of the present example uses a positive going transition in the middle of a bit to represent 0 and a negative going transition in the middle of a bit to represent 1.

Figure 1:
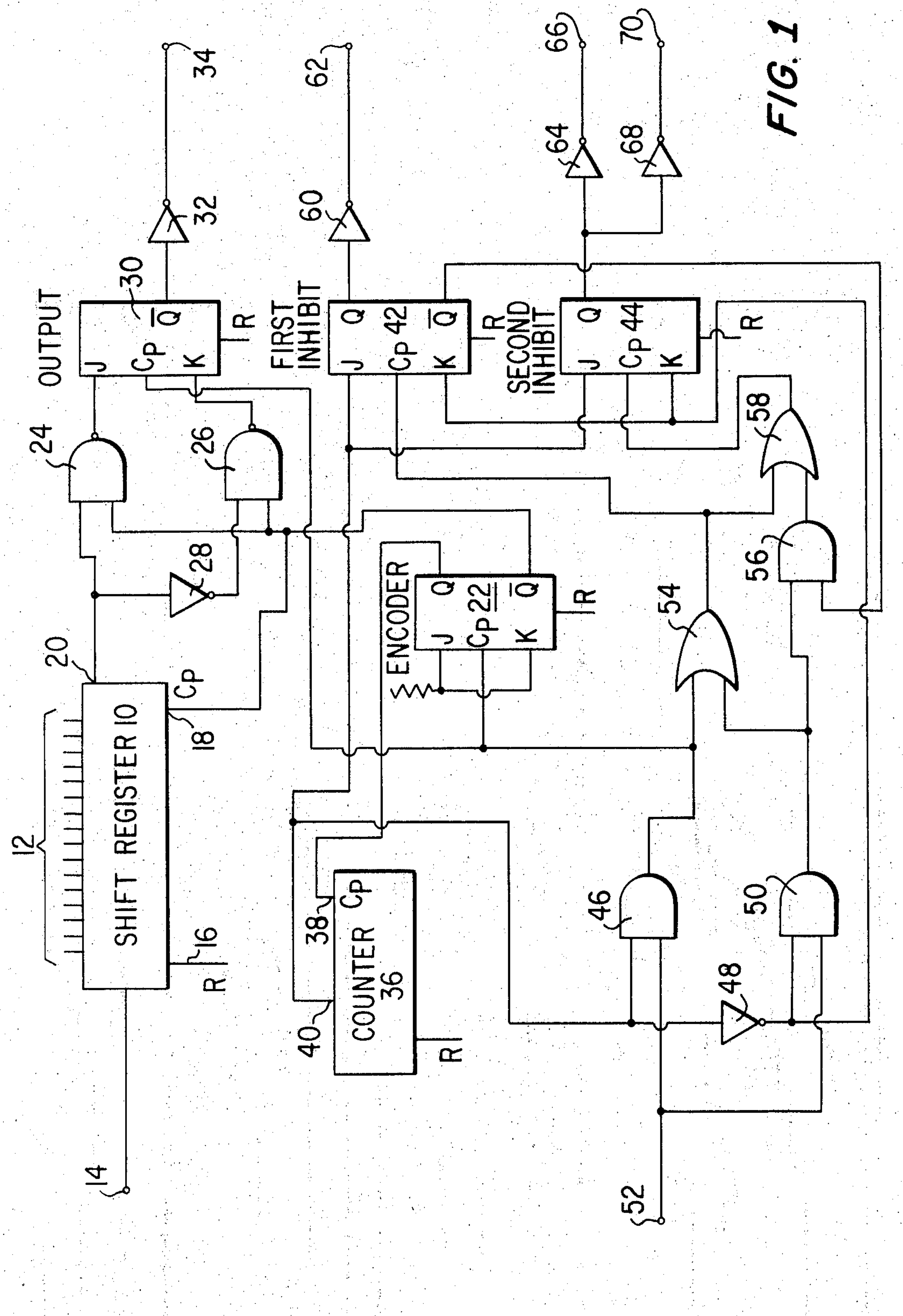
FIG. 1 is a schematic diagram of a transmitter sequencer according to the present invention.

The transmitter sequencer encoder portion, FIG. 1, includes a shift register 10 having a plurality of inputs 12, a load pulse input 14, a reset pulse input 16, a clockpulse input 18, and an output 20. A J–K flip flop 22 serves as an encoder. The J an K inputs of the encoder are tied to a 1 input so that it will toggle on each clock pulse to its clock pulse input Cp. The $\overline{Q}$ output of the encoder is connected to the clock pulse input 18 of register 10 and as one input to each of NAND gates 24 and 26. The output 20 of the register 10 is directly connected to the other input of NAND gate 24 and through inverter 28 to the other input of NAND gate 26. The outputs of NAND gates 24 and 26 are connected to the J and K inputs, respectively of the output J–K flip flop 30, the $\overline{Q}$ output of which is fed through inverter 32 to the output terminal 34.

Counter 36 has its clock pulse input 38 connected to the Q output of encoder flip flop 22 and has an output 40 connected to the J inputs of first inhibit flip flop 42 and second inhibit flip flop 44. This output is also connected to AND gate 46 and inverter 48. The output of inverter 48 is connected to AND gate 50 and to the K inputs of the inhibit flip flops 42 and 44. A gated 2 MHz clock pulse is connected from a source, not shown, to terminal 52 and gates 46, 50. The output of AND gate 46 is connected to OR gate 54, to the clock pulse input of encoder flip flop 22 and to the clock pulse input of output flip flop 30. The output of AND gate 50 is also connected to OR gate 54 and to AND gate 56 which also is connected to the $\overline{Q}$ output of first inhibit flip flop 42. The output of AND gate 56 is connected to OR gate 58. The output of OR gate 54 is connected to OR gate 58 and to the clock pulse input of first inhibit flip flop 42. The output of OR gate 58 is fed to the clock pulse input of second inhibit flip flop 44. The Q output of first inhibit flip flop 42 is fed through inverter 60 to first inhibit terminal 62 and the Q output of second inhibit flip flop 44 is connected through inverter 64 to second inhibit terminal 66 and through inverter 68 to receiver inhibit terminal 70. This last mentioned inhibit output is used by a receiver (not shown) normally associated with a transmitter to inhibit the receiver anytime there is a message transmitted.

Figure 2:
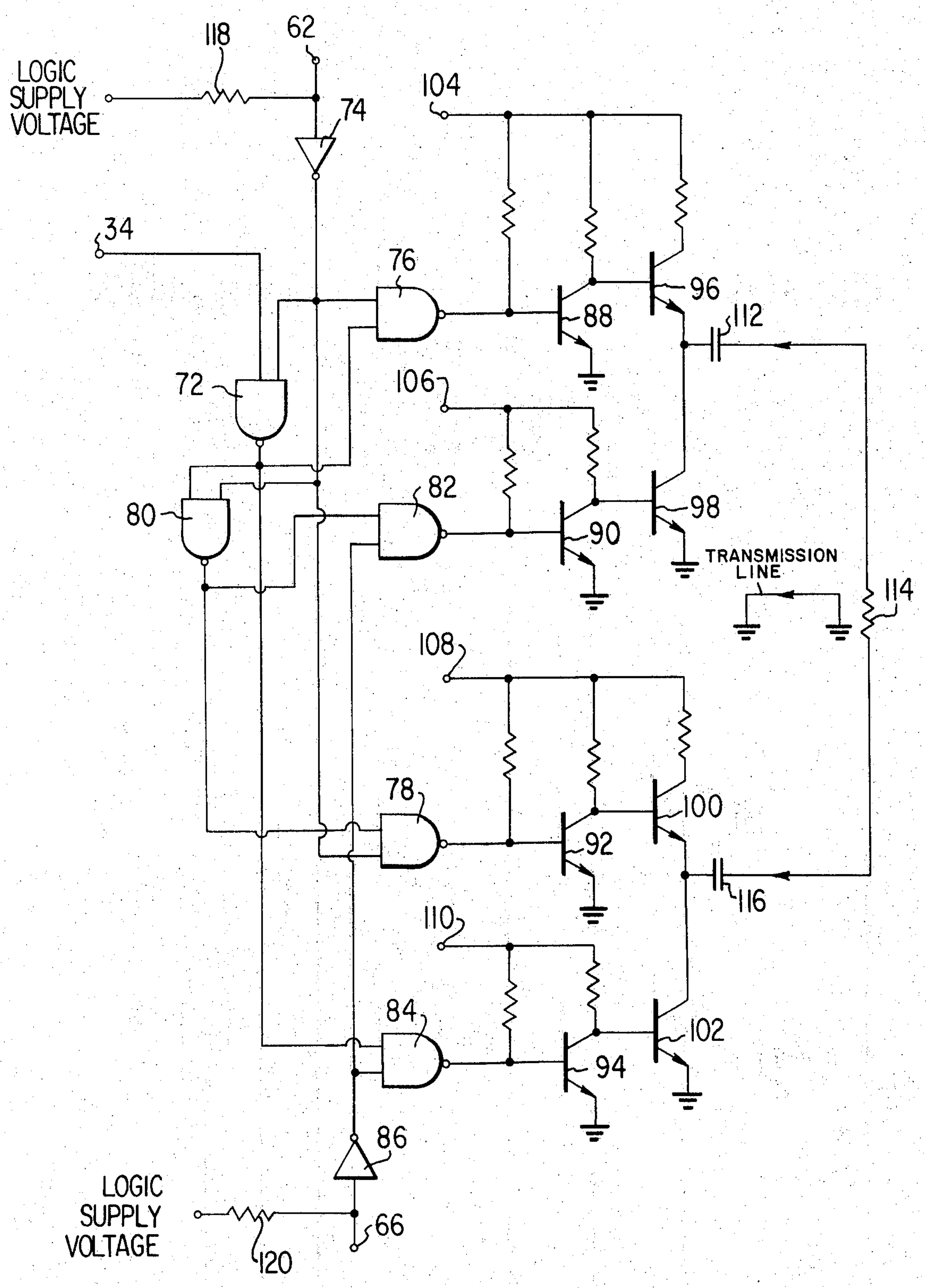
FIG. 2 is a schematic diagram of a line driver according to the present invention.

The line driver, see FIG. 2, has a NAND gate 72 with one input connected to data terminal 34 and its second input connected to first inhibit terminal 62 through interter 74. The output of this inverter is also connected to one input of NAND gates 76, 78. The second input of gate 76 is connected to the output of NAND gate 72 which is also connected to an input of NAND gate 80. NAND gate 80 has its other input connected to inverter 74 and its output connected to NAND gates 78 and 82. Second inhibit terminal 66 is connected to NAND gates 82 and 84 through inverter 86. The outputs of gates 76, 78, 82 and 84 are connected to the bases of grounded emitter transistors 88, 92, 90 and 94, respectively. The collectors of these transistors are connected to the bases of transistors 96, 98, 100 and 102 and to a drive voltage applied to terminals 104, 106, 108 and 110. The emitter of transistor 96 and collector of transistor 98 are connected together and to capacitor 112 and the transmission line, schematically represented by resistor 114. The emitter of transistor 100 and collector of transistor 102 are similarly connected to the line 114 through capacitor 116. Logic supply voltage is fed to inverters 74 and 86 through resistors 118 and 120, respectively.

It should be again noted, with reference to FIG. 3, that in a biphase Manchester code a positive transition in the center of a bit designates a 0 and a negative transition a 1. Also, every message is preferably proceded by a three bit synchronization code having a 011 pattern as shown. It is the purpose of the present transmitter sequencer to provide an output which, when connected to the line driver, will cause the voltage on the transmission line to change in a manner which follows the bit output from the register. This is accomplished through the use of the encoder and output flip flops and the NAND gates 24 and 26 in the manner described below.

A reset pulse is sent to counter 36, register 10, encoder flip flop 22, output flip flop 30, first inhibit flip flop 42 and second inhibit flip flop 44 to clear all the flip flops. A load pulse causes the desired message, including the synchronization code, to be loaded into register 10. The output 20 of the register will be 0, which is the first bit of the synchronization code. The $\overline{Q}$ output of the encoder 22 is 1 so that the input to NAND gate 24 is 01 and the input to NAND gate 26 11. Thus there will be a 1 at the J input of output flip flop 30 and a 0 on the K input. The output 40 from counter 36 will be 1 which is applied to the J inputs of inhibit flip flops 42 and 44 and to inverter 48 where it is inverted and fed to the K inputs of the inhibit flip flops 42 and 44 as a 0. The Q outputs of both inhibit flip flops will be 0 which is applied to NAND gates 76, 78, 82 and 84 of the line driver through inverters 60 and 64 and then inverters 74 and 76. These NAND gates will have a 1 output which turns on driver transistors 88, 90, 92 and 94 and holds line driver transistors 96, 98, 100 and 102 cut off.

The first clock pulse from the gated 2 MHz clock pulse source (not shown) will pass through AND gate 46 to the clock pulse inputs of encoder flip flop 22 and output flip flop 30 and through OR gate 54 to the clock pulse input of first inhibit flip flop 42 and OR gate 58 to the clock pulse input of second inhibit flip flop 44. This clock pulse will cause flip flops 22, 42 and 44 to change state and produce a 1 at their Q outputs, thereby removing the inhibit from the line driver gates. The Q outputs of the encoder and output flip flops also go to 1. The $\overline{Q}$ output of the encoder 22 is now 0 so that there will be a 1 at both the J and K inputs of output flip flop 30, which will cause the output flip flop to toggle on the next clock pulse.

The Q output from the output flip flop 30 will be 0 at the input to NAND gate 72 and a 1 input to NAND gates 80, 82 and 84, a 0 output to transistors 88 and 94 causing them to cut off and allowing transistors 96 and 102 to conduct to place a negative voltage on the transmission line.

The second clock pulse causes the output flip flop 30 to toggle since it has a 1 on both the J and K inputs. This causes a positive going transition in the center of the bit, as required for a 0, by changing the output flip flop $\overline{Q}$ output to 1 which causes the output of NAND gate 72 to be placing a 0 at the input of gates 76 and 84 and causing their outputs to become 1 turning on transistors 88 and 94 while cutting off transistors 96 and 102. This same 0 from NAND gate 72 will become a 1 output from NAND gate 80 to the inputs of NAND gates 78 and 82 which will have a 0 output to cutoff transistors 90 and 92 while allowing transistors 98 and 100 to conduct and drive the transmission line positive.

The state of encoder flip flop 22 is changed by the second clock pulse for a $\overline{Q}$ output of 1 and causes the counter 36 to be clocked, at half the rate of the encoder, and the register 10 to be shifted one bit. The counter changes on the rise of a clock pulse and the register on the fall of the clock pulse.

The Q output 20 of the register 10 is now 1 (the second bit of the synchronizing code) and both inputs to NAND gate 24 are 1 to the J input of the output flip flop 30 is 0. Since one input to NAND gate 26 is 0, its output is 1 and the K input of flip flop 30 is 1.

The $\overline{Q}$ output of flip flop 30 is now 0. The third clock pulse does not change this output (see the timing diagram). The encoder flip flop 22 is toggled by the third clock pulse giving a 0 $\overline{Q}$ output resulting in a 1 at both the J and K inputs of flip flop 30.

The fourth clock pulse causes the output flip flop 30 to again toggle and cause a negative going transition at the center of the bit indicating a 1. This is accomplished by the $\overline{Q}$ output of output flip flop 30 going to 1.

A 1 output from flip flop 30 causes a 0 output from NAND gate 72 and a 1 output from NAND gates 76 and 84 which will cause transistors 88 and 94, respectively, to conduct and drive transistors 96 and 102, respectively, to cut off. The output of NAND gate 80 will be 1 causing a 0 output from NAND gates 78 and 82 to turn transistors 90 and 92 off and drive transistors 98 and 100 on. Under these conditions current flows from the source at terminal 108 through transistors 100 and 98 to ground. This forms a downwardly directed transistion of a 1 bit output. The next clock pulse causes a reversal of the on-off states of the transistors and thus produces a positive going transition.

The toggling of the encoder by the fourth clock pulse will cause the third bit of the synchronizing code, which is also 1, to be shifted to the Q output 20 of the register 10 and the $\overline{Q}$ output of the encoder 22 is again 1. The J input of output flip flop 30 will therefor be 0 and the K input 1.

The fifth clock pulse changes the $\overline{Q}$ of the output flip flop from 1 to 0 and produces a positive transition between the second and third bits (refer to the action taking place in response to the second clock pulse). This makes the $\overline{Q}$ output of the output flip flop 30 such that on the sixth clock pulse there is a negative transition in the center of the bit for a 1.

Upon reaching a count equal to the length of the message, for example 35, the output 40 from the counter 36 goes to 0 causing the J inputs of inhibit flip flops 42 and 44 to go to 0 while the K inputs, from inverter 48, go to 1. The 0 on gate 46 will prevent further clock pulses from reaching the encoder 22 and output 20. The next clock pulse, Cp 36, will cause first inhibit flip flop 42 to change state placing a 0 on the Q output and a 1 on the $\overline{Q}$ output. The $\overline{Q}$ output is fed to enable AND gate 56 and Or gate 58 so that the next clock pulse, Cp 37, will cause second inhibit flip-flop 44 to change state and have a 0 on its Q output. Both transistors 98 and 102 are turned on and capacitors 112 and 116 are thus connected to ground.

The first clock pulse after the end of the message, Cp 36, causes the Q output of the first inhibit flip flop to go to 0. This causes a 0 at the input of NAND gates 72, 76, 78 and 80 and the outputs of these gates become 1. The Q output of the second inhibit flip flop 44 is still a 1 so tha the input to NAND gates 82 and 84 is 1. Since both the inputs to gates 82 and 84 are 1 their outputs will be 0 thus allowing transistors 98 and 102 to conduct. This connects both line drive capacitors 112 and 116 to ground causing them to discharge. At the same time, since one input to gates 76 and 78 is 0, these outputs are 1 to allow transistors 88 and 92 to conduct and cut off transistors 96 and 100 thereby disconnecting the capacitors 112 and 116 from the voltage at terminals 104 and 108.

On the second clock pulse after the end of the message, Cp 37, the Q output of the second inhibit flip flop 44 goes to 0 and the inputs to gates 82 and 84 to go to 0. The outputs of these gates is then 1 to turn on transistors 90 and 94 and cut off transistors 98 and 102. This at this point in time all of the line drive transistors 96, 98, 100 and 102 are disconnected from the transmission line.

The operation of the transmitter sequencer can be summerized as follows:

1. On the odd numbered clock pulses the Q output of the register 10 is gated through the NAND gates 24 and 26 to the J and K inputs of the output flip flop 30 such that the next clock pulse will cause a positive transition for a $\overline{Q}$ of 0 and a negative transition for a $\overline{Q}$ of 1.

2. The same odd numbered clockpulses change the state of the encoder flip flop 22 so that its $\overline{Q}$ output is 0. Since a 0 input to a NAND gates causes a 1 output, both the J and K inputs of output flip flop 30 are 1.

3. Since a J and K flip flop toggles on a clock pulse when both the J and K inputs are 1, the next (even numbered) clockpulse causes its output to change state. It is this change which produces the desired transition in the center of the bit time of the biphase Manchester code.

Therefore, the $\overline{Q}$ of the output flip flop is made 1 for a 0 of the Q output of the register on the odd numbered clockpulses. This is determined by the Q output of the register 10 and NAND gates 24 and 26 connected to the J and K inputs of output flip flop 30. The same odd numbered clock pulse that causes the proper Q output also toggles the encoder flip flop 22 and puts a 0 at the input of both gates 24 and 26. This causes a 1 to be at the J and K inputs of the output flip flop 30, and with this input the next clockpulse causes it to toggle. The entire message is developed in this manner. The odd numbered clockpulses cause the Q output of the output flip flop to be such that the even numbered (or toggle) clock pulses generate the desired transition in the center of the bit time.

It should be noted that when the bit sequence is 01 or 10 there is no change in the output flip flop at the time between bits, but when the sequence is 00 or 11 then there is a change of state so that the output will again (after the toggle for the first bit) be in the same state for the toggle of the second bit.

Inasmuch as the present invention is subject to many variations, modifications and changes in detail, it is intended that all matter contained in the foregoing description or shown in the accompanying drawings shall be interpeted as illustrative and not in limiting sense.

What is claimed is:

1. A transmitter sequencer for forming biphase coded message, each bit of said biphase coded message having a bit time with a transition near the center of said bit time, and for driving a transmission line in accordance with said biphase coded message, said transmitter sequencer comprising register means for receiving input levels corresponding to a message to be encoded and for sequentially supplying said input levels to an output of said register means;

output flip flop means having data input means, toggle input means and data output means;

means for generating clock pulses at a first frequency;

encoder means responsive to said clock pulses for generating enabling pulses at a second frequency half of said first frequency such that said clock pulses occur near the center of the period between successive enabling pulses;

gating means for receiving said input levels from said output of said register means and responsive to said enabling pulses to supply gated signals to said data input means of said output flip flop means;

said clock pulses being supplied to said toggle input means of said output flip flop means to place said output flip flop means in a first state in accordance with said gated signals from said first gating means and to toggle said output flip flop means to a second state between successive enabling pulses; and line driving means responsive to signals at said data output means representing the state of said output flip flop means to drive a transmission line with a voltage whereby voltage applied to the transmission line is representative of said biphase coded message with a transition during each bit time corresponding to the toggling of said output flip flop means.

2. A transmitter sequencer according to claim 1 and further comprising counter means for counting enabling pulses from said encoder means, and inhibit means for inhibiting said line driving means, said counter means having an output controlling said inhibit means to enable said inhibit means at the end of the said message.

3. A transmitter sequencer according to claim 2 wherein said inhibit means includes normally inhibited gating means receiving said signals at said data output flip flop means, and said line driving means includes a voltage source, normally non-conducting line driving transistor means connected to drive the transmission line from said voltage source, and normally conducting transistor means responsive to said normally inhibited gating means to control said line driving transistor means to maintain said line driving transistor means non-conductive as long as said normally inhibited gating means is inhibited.

4. A transmitter sequencer according to claim 1 wherein said output flip-flop means is a J–K flip flop.

5. A transmitter sequencer according to claim 3 wherein said line driving means includes capacitor means connected between the transmission line and said line driving transistor means, and means responsive to said counter means to render said line driving transistor means conductive to discharge said capacitor means at the end of said message.

* * * * *